United States Patent [19]

Ohnishi et al.

[11] Patent Number: 5,198,672
[45] Date of Patent: Mar. 30, 1993

[54] SIGNAL GENERATOR AND METHOD OF GENERATING SIGNAL VOLTAGES USING THE SAME

[75] Inventors: Tsuyoshi Ohnishi, Kokubunji; Tohru Ishitani, Sayama; Moritoshi Yasunaga, Kawaguchi, all of Japan

[73] Assignee: Hitachi, Ltd., Tokyo, Japan

[21] Appl. No.: 391,292

[22] Filed: Aug. 9, 1989

[30] Foreign Application Priority Data

Sep. 19, 1988 [JP] Japan .................................. 63-232363
Apr. 28, 1989 [JP] Japan .................................. 1-107614

[51] Int. Cl.$^5$ .................................................. G01T 1/24
[52] U.S. Cl. ........................... 250/376.01; 250/370.14; 324/158 T
[58] Field of Search .................. 250/310, 311, 370.01, 250/370.02, 370.05, 370.14, 392, 370.07; 324/97, 158 T

[56] References Cited

U.S. PATENT DOCUMENTS

| | | | |
|---|---|---|---|
| 3,531,716 | 9/1970 | Tarui et al. | 324/501 |
| 4,152,595 | 5/1979 | Garfinkel et al. | 250/370.01 |
| 4,213,045 | 7/1980 | Fraass et al. | 250/370.07 |
| 4,484,076 | 11/1984 | Thomson | 250/370.07 |
| 4,608,493 | 8/1986 | Hayafuji | 250/397 |
| 4,835,383 | 5/1989 | Mahoney et al. | 250/281 |

OTHER PUBLICATIONS

Sharkov et al., Broadband Converter for Converting the Current of SemiConductor Nuclear-Radiation Detectors into a Sequence of Pulses, Jul. 7, 1971.
Kirschner et al., A Simple Bakeable Particle Detector: Low-Electron Converter Plus Solid State Electron Detector, Oct. 1976.
Higgins, Electronics with Digital & Analog Integrated Circuits, 1983, pp. 38-41, 46.

Primary Examiner—Carolyn E. Fields
Assistant Examiner—Drew A. Dunn
Attorney, Agent, or Firm—Antonelli, Terry Stout & Kraus

[57] ABSTRACT

A device for generating voltage signals in a semiconductor device upon irradiation with a charged particle beam, wherein a circuit for converting a beam current of the irradiated charged particle beam into the voltage signals is constituted by a bipolar transistor and a load device contained in the semiconductor device, and a portion of the line pattern connected to the base of the bipolar transistor is irradiated with the charged particle beam, so that signals are generated at high speeds even by using a weak charged particle beam without permitting the device to be broken down.

16 Claims, 5 Drawing Sheets

SIGNAL GENERATOR AND METHOD OF GENERATING SIGNAL VOLTAGES USING THE SAME

BACKGROUND OF THE INVENTION

The present invention relates to a signal generator which generates signals in a semiconductor device by utilizing a charged particle beam and to a method of generating signals using the same.

The prior art of this kind has been disclosed in, for example, U.S. Pat. No. 3,531,716. According to this prior art as shown in FIG. 2, reverse bias characteristic of pn junction of a semiconductor is utilized to generate a voltage signal on a metallic electrode 102 connected to a p-type region 101 provided in an n-type region 104 by irradiating the metallic electrode 102 with an electron beam 103. The specification of the above U.S. patent further describes a method in which a supply terminal of a semiconductor circuit is irradiated with the electron beam and the circuit is operated with the beam current as a source of current. Another prior art can be found in the Journal of Vacuum Science and Technology, 19, 1981, pp. 1010–1013 according to which, as shown in FIG. 3, the pn junction of a diode element 201 is irradiated with an electron beam 202 to operate a flip-flop circuit 203. Namely, a high-speed switching operation is realized by utilizing the function of current amplification in the pn junction portion despite the beam current is small.

The prior art shown in FIG. 2 can be evaluated for its idea and method for generating voltage signals in the device upon irradiation with an electron beam. There, however, is left a problem in that since a beam current of an irradiated charged particle beam is converted directly into a voltage signal through a load device, an extended period of time is required for generating a signal when a beam current of a weak focused beam is used, and a circuit in the latter stage must have a very high impedance. The prior art shown in FIG. 3 is excellent in that the current is amplified through the input stage on which a probe beam is incident, solving the problem inherent in the prior art of FIG. 2. However, since the pn junction portion must be irradiated with a beam, the probe point (beam irradiation position) is limited to a place where a diode can be formed. Further, when the probe beam that is used consists of an ion beam, the pn junction portion of the diode element is broken down by the sputtering which makes it impossible to use this circuit setup.

SUMMARY OF THE INVENTION

The object of the present invention is to provide a signal generator which is capable of quickly generating signals even when a probe beam is weak beam current, which can form a probe point at any place, and which is not broken down by the irradiation with the probe beam.

The above object is achieved by using a bipolar transistor to constitute a circuit that converts a beam current of probe beam into a voltage signal, and by irradiating a line pattern connected to the base of the bipolar transistor with a charged particle beam. The signals can be generated more quickly if the circuit is constituted using a plurality of bipolar transistors in such a manner that a front bipolar transistor will not effect the voltage amplification function.

Since a bipolar transistor is used to constitute a circuit that generates a signal voltage upon irradiation with a charged particle beam, a voltage signal of a sufficiently large value can be generated by the function of current amplification of the bipolar transistor even when the beam current is weak. Further, since the bipolar transistor is a tri-electrode device, a line pattern can be extended from the base to any pattern. Therefore, if a portion of the extended line pattern is irradiated with the charged particle beam, the probe point can be set at any place and the transistor device is not broken down by the irradiation with the charged particle beam. It is further allowable to constitute the signal voltage generating circuit using plural stages of bipolar transistors in a manner that the front bipolar transistor will not amplify the voltage, in order to generate signals at much higher speeds yet prevent the decrease of response speed caused by mirror effect.

DESCRIPTION OF THE PREFERRED EMBODIMENTS

Embodiments of the invention will now be described in conjunction with the drawings.

Figure 1A:
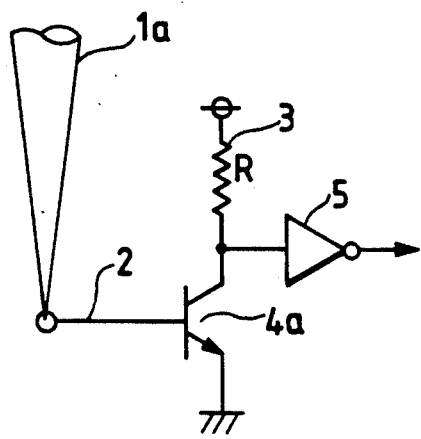
FIGS. 1A and 1B are schematic diagrams illustrating the fundamental constitution of a signal generator according to an embodiment of the present invention.
Figure 1B:
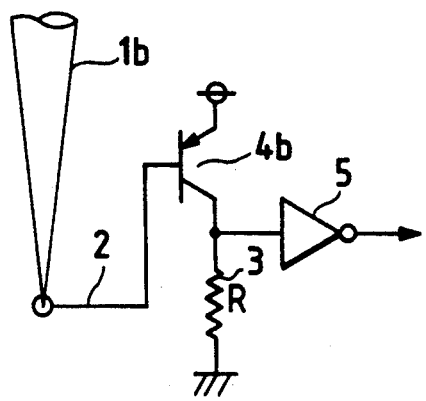
Figure 2:
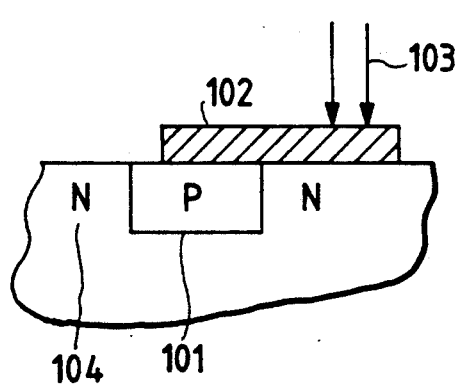
FIGS. 2 and 3 are schematic diagrams illustrating a signal generator according to a prior art.
Figure 3:
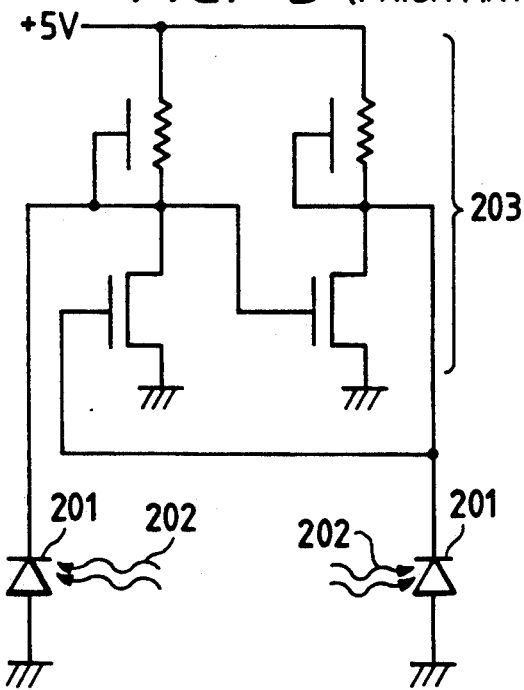

FIGS. 1A and 1B illustrate a fundamental embodiment of the present invention, wherein FIG. 1A shows a signal generating circuit of the case when an ion beam is used as a probe beam. A common-emitter bipolar transistor (npn transistor) 4a is pulled up by a load device 3 having a resistance R in order to transmit the potential of collector to the following logic device 5. As an ion beam 1a illuminates the line pattern 2 connected to the base of the transistor 4a, there flows a base current which is amplified by the transistor by its current gain (hfe) times to form a collector current such that the transistor 4a is rendered conductive. As the collector current flows, the collector potential drops across the load device 3 and the input to the logic device 5 becomes "0". If irradiation of the ion beam 1a is turned off or is moved to another location, no base current will flow and no collector current flows either, causing the collector potential to rise. In this case, the input to the logic device 5 becomes "1". As described above, even when a weak ion beam is used as a probe beam, a logic signal is generated in the device owing to the current amplification function of the bipolar transistor. Furthermore, since the beam falls on the line pattern that is connected to the base, the transistor is not broken down by the irradiation with the ion beam. The common-emitter circuit of a bipolar transistor has features in that it has a smaller input impedance than that of the emitter follower circuit and that it is immune to noise. When the circuit is liable to be affected by noise such as due to the presence of a high-frequency signal source nearby, the line pattern connected to the base should be shielded with a conductor pattern of ground potential to make the circuit immune to noise.

When a sample is irradiated with a charged particle beam, secondary electrons are emitted in relatively large amounts. Therefore, when the line pattern connected to the base of the transistor is irradiated with the charged particle beam, a current that flows into the base becomes the sum of a current value of the incident beam and a current value of the secondary electrons that are emitted secondarily. In using the ion beam as a probe beam, therefore, if a material having a high yield of secondary electrons is used as the line pattern for the base electrode, a required base current is obtained even with a weak incident beam current making it possible to generate a sufficiently large signal. Because of this reason, it is desired to use a material having a yield of secondary electrons that is greater than 1. The whole base wiring pattern needs not be composed of a material having a high yield of secondary electrons but only those portions that are to be irradiated with ion beam may be composed of a material having a high yield of secondary electrons, or those portions only may be provided with a surface layer composed of a material having a high yield of secondary electrons.

FIG. 1B illustrates a circuit of the case where the electron beam 1b is used as a probe beam. The bipolar transistor 4b is of the pnp-type and a pull-down resistor 3 is connected to the collector thereof. The circuit operation resembles that of the circuit of FIG. 1A and is not described here. When the line pattern 2 connected to the base has the yield of secondary electrons that is 1 (one secondary electron is emitted for one electron that is incident), no base current flows even when the wiring pattern 2 is irradiated with the electron beam. When the electron beam is used as a probe beam, therefore, at least the portions of the line pattern 2 to be irradiated with the electron beam should be composed of a material having a small yield of secondary electrons (which is smaller than 1), such that a required base current can be obtained even when a weak electron beam is used. Furthermore, the base current can be efficiently obtained even when the portions irradiated with the beam is constructed in a shape of a Faraday cup such that the secondary electrons once emitted are absorbed in the line.

Figure 4:
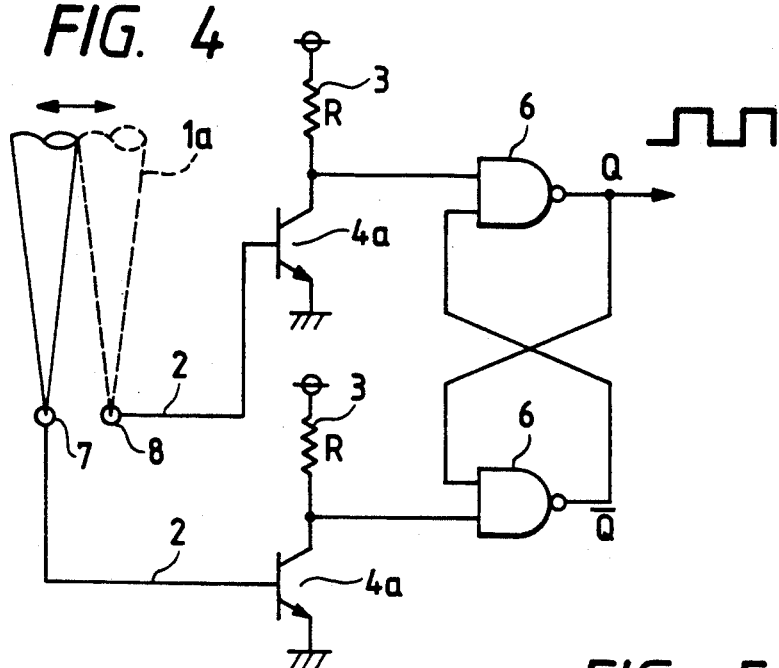
FIG. 4 is a schematic diagram illustrating an embodiment for generating input signals to a flip-flop circuit using a signal generator of the present invention.

FIG. 4 illustrates an embodiment in which the input signals to the flip-flop circuit are generated by the signal generating circuit of the present invention. The focused ion beam is used as a charged particle beam 1a having a beam diameter of 1 μm and a beam current of 80 pA. The bipolar transistor 4a is of the npn-type and the load device 3 has a resistance of R=100 kiloohms. The flip-flop circuit is constituted by complementary MOS NAND gates 6. As a set terminal 8 and a reset terminal 7 are alternatingly irradiated with an ion beam, the flip-flop circuit repeats the set and reset operations making it possible to set the logical stage in the device with a weak beam current (=80 pA).

Figure 5A:
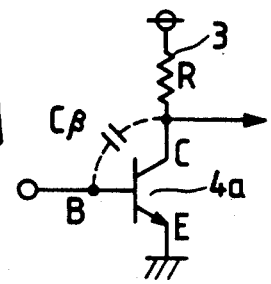
FIGS. 5A, 5B and 5C are schematic diagrams illustrating circuit constitutions of the signal generator according to another embodiment of the present invention.

The above embodiment deals with an example of using a common-emitter one-stage bipolar transistor circuit. To adapt the signal generation system of the present invention even to those devices having high degrees of integration, it becomes necessary to further reduce the diameter of the probe beam that is used and the probe beam becomes more weak accordingly. In a circuit using a one-stage bipolar transistor 4a as shown in FIG. 5a, the base-collector capacitance $C_\beta$ (usually several picofarads) of the transistor 4a forms a mirror capacity which a multiplied by about amplification factor $h_{fe}$ times of the transistor (usually multiplied by about 50 to 300 times) accompanying the amplification function of the bipolar transistor 4a, and the input side is affected through the mirror capacity. When the probe current is weak, in particular, this effect becomes not negligible. The mirror effect is the phenomenon in which when there is an inverted amplifier having a voltage gain of A times and a capacity C between the input and the output, there appears a capacitance (mirror capacitance) equal to C multiplied by A times between the input and a ground potential point (GND).

Figure 5B:
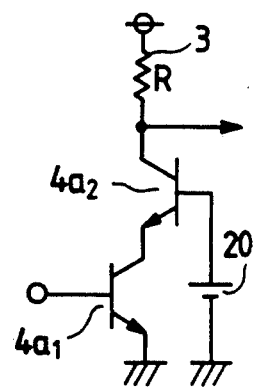
Figure 5C:
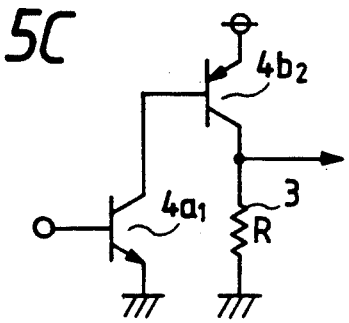

Presumed below is the case where the base terminal of the bipolar transistor 4a of FIG. 5A is irradiated with the charged particle beam. The charged particle beam is considered to be a constant current source, and the operation speed of the circuit is delayed in proportion to the value of mirror capacitance. To operate the circuit at high speeds upon irradiation with a fine and weak charged particle beam, it becomes necessary to eliminate the mirror effect. For this purpose, use can be made of a cascade circuit shown in FIG. 5B which consists of a combination of a common-emitter circuit formed by a bipolar transistor $4a_1$ of the input stage and a following common-base circuit formed by a bipolar transistor $4a_2$, or a two-stage common-emitter circuit shown in FIG. 5C constituted by using complementary transistors $4a_1$ and $4b_2$. In these circuits, the transistor $4a_1$ of the input stage does not have a voltage gain, and the corrector potential of the input-stage transistor $4a_1$ remains constant irrespective of the current that flows into the input-stage bipolar transistor $4a_1$. Therefore, no feedback is applied and no mirror effect takes place. The speed can be further increased if use is made of a transistor having a small base-collector capacitance $C_\beta$ as the bipolar transistor $4a_1$ of the input stage. Further, the current amplification factor can be increased by Darlington-connecting the input-stage transistor $4a_1$.

Figure 6A:
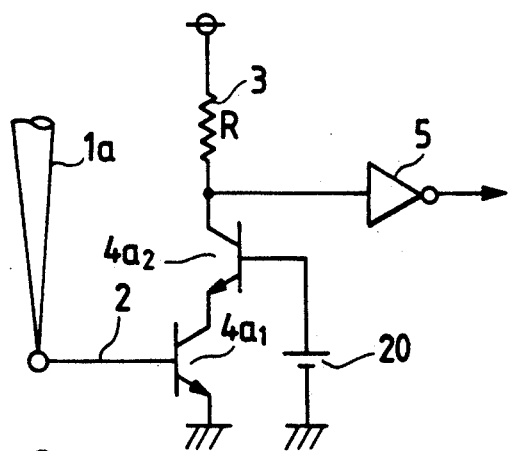
FIGS. 6A and 6B are schematic diagrams illustrating circuit constitutions of the signal generator using a cascade circuit according to a further embodiment of the present invention.
Figure 6B:
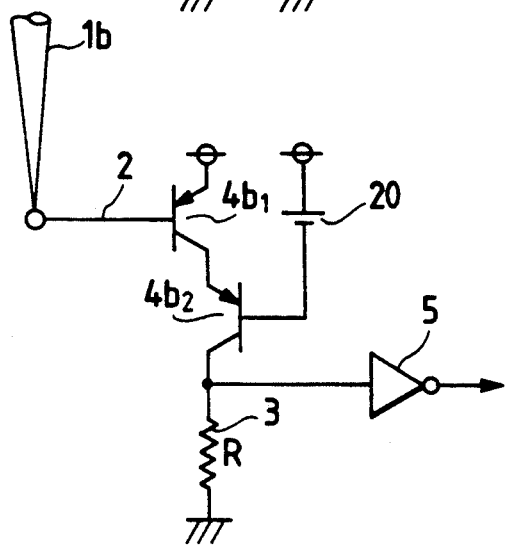

FIGS. 6A and 6B illustrate an embodiment of the present invention using a cascade circuit, wherein FIG. 6A shows a circuit of the case where the ion beam is used as a probe beam, and a common-base npn transistor $4a_2$ of the second stage is connected in cascade to the common-emitter npn transistor $4a_1$ of the input stage. The collector potential of the transistor $4a_2$ of the second stage is pulled up by a load device 3 having a resistance R and is transmitted to the following logic device 5.

As the ion beam 1a falls on the line pattern 2 connected to the base of the input-stage transistor $4a_1$, a base current flows into the base of the input-stage transistor $4a_1$ and is amplified by current amplification factor hfe times of the transistor $4a_1$ to form a collector current (input-stage transistor $4a_1$ is on) which then serves as an emitter current the transistor $4a_2$ of the second stage that is operating with its base grounded. Here, a voltage source 20 is connected to the base of the transistor $4a_2$ of the second stage. In this circuit, the transistor $4a_1$ of the input stage does not amplify the voltage. Therefore, the collector potential of the input-stage transistor $4a_1$ does not change irrespective of the beam current, and mirror effect does not take place. When the transistor $4a_2$ of the second stage is turned on, the collector potential of the transistor $4a_2$ drops due to voltage drop across the load device 3, and the input to the logic device 5 becomes "0". If the ion beam $1a$ is turned off or is moved to other place, no base current flows into the transistor $4a_1$ of the input stage and the transistors $4a_1$ and $4a_2$ and turned off. In this case, the input to the logic device 5 is "1". Thus, even when the weak ion beam is used as a probe beam, a logic voltage can be generated in the device owing to the current amplification function of the transistor. To increase the current amplification factor, furthermore, the transistor $4a_1$ of the input stage should be Darlington-connected. Moreover, since the beam is incident on a portion of the line pattern connected to the base of the transistor $4a_1$ of the input stage, the transistor is not broken down by the irradiation with ion beam. The common-emitter circuit of the transistor $4a_1$ of the first stage has a smaller input impedance and is more immune to noise than the emitter-follower circuit. When the circuit is liable to be affected by noise due to the presence of, for example, a signal source of a high frequency nearby, the line pattern connected to the base of the input-stage transistor $4a_1$ should be shielded with a conductor pattern of ground potential so as not to be affected by noise. As mentioned earlier, when the ion beam is used as a probe beam, a required signal voltage can be generated even with the weak ion beam provided a material having a large yield of secondary electrons (desirably greater than 1) is used for at least a portion of the line pattern which is irradiated with the beam and which is connected to the base of the input-stage transistor $4a_1$.

FIG. 6B shows a circuit of the case when the electron beam $1b$ is used as a probe beam. Transistors $4b_1$ and $4b_2$ of the pnp type are used to constitute a cascade circuit. Operation of the circuit resembles that of the circuit of FIG. 6A and is not described here. In this circuit, also, the transistor $4b_1$ of the input stage does not work to amplify the voltage, and no mirror effect takes place. When the line pattern 2 that is connected to the base of the transistor $4b_1$ and that is irradiated with the beam is composed of a material whose yield of secondary electrons is 1 (one secondary electron is emitted for one incident electron), no current flows to the base of the input-stage transistor $4b_1$ even when the beam is incident thereupon. Therefore, the line pattern 2 of at least a portion irradiated with the beam should be composed of a material that has a small yield of secondary electrons (smaller than 1). Furthermore, the portion irradiated with the beam may be formed in the shape of a Faraday cup such that the secondary electrons once emitted are absorbed by the line.

The cascade circuit shown in FIGS. 6A and 6B are constituted using transistors of either the npn type or the pnp type, making it possible to facilitate the manufacturing process.

Figure 7A:
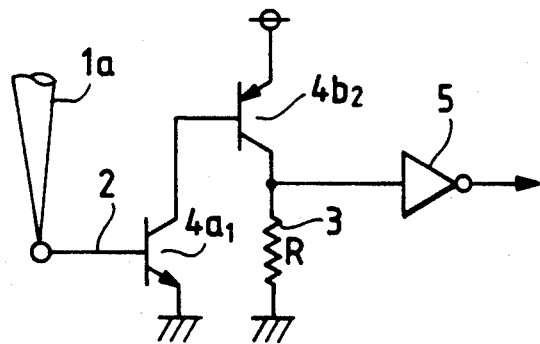
FIGS. 7A and 7B are schematic diagrams illustrating circuit constitutions of the signal generator using a two-stage common-emitter circuit according to a still further embodiment of the present invention.
Figure 7B:
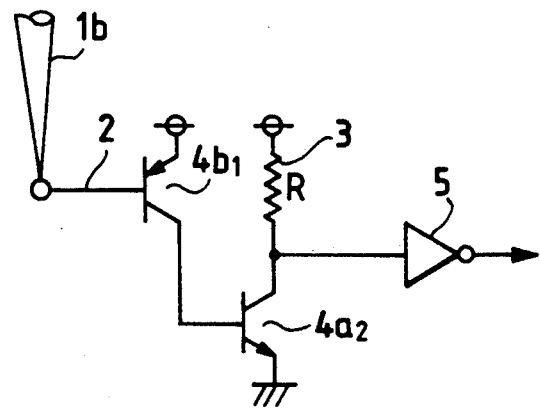

FIGS. 7A and 7B illustrate another embodiment of the present invention using a common-emitter circuit in which two transistors are connected in two stages in series. FIG. 7A shows a circuit of the case when the ion beam $1a$ is used as a probe beam and in which a common-emitter npn transistor $4a_1$ of the input stage and a common-emitter pnp transistor $4b_2$ if the second stage are connected in series, the collector of the pnp transistor $4b_2$ of the second stage being pulled down via a load device 3 having a resistance R and the collector potential being transmitted to the following logic device 5. In this circuit, the transistor $4a_1$ of the input stage does not amplify the voltage just like the cascade circuit shown in FIGS. 6A and 6B. Therefore, the collector potential of the input-stage transistor $4a_1$ remains nearly constant irrespective of the beam current, and no mirror effect takes place.

FIG. 7B shows a circuit of the case when the electron beam $1b$ is used as a probe beam. In this case, a common-emitter pnp transistor $4b_1$ of the input stage and a common-emitter npn transistor $4a_2$ of the second stage are connected in series. In this circuit, also, the transistor $4b_1$ of the input stage does not amplify the voltage, and no mirror effect develops. The embodiment using the two-stage series common-emitter circuit shown in FIGS. 7A and 7B exhibits increased amplification factor and operates even on a low power source voltage. The manufacturing process, however, becomes complex to some extent since both the transistor of the pnp type and the transistor of the npn type are used.

In the foregoing were described the embodiments which do not permit response speed to be decreased by the mirror effect. By employing the transistors having a small base-collector capacitance $C_\beta$, the speed can be further increased as a matter of course.

Figure 8:
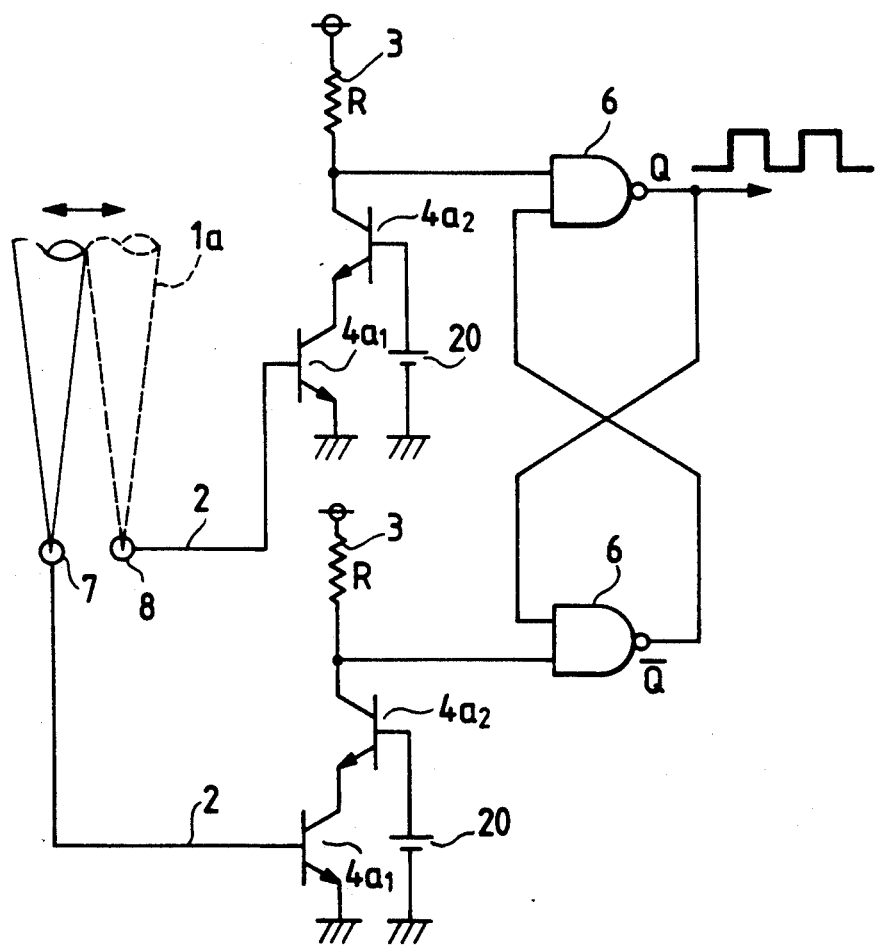
FIG. 8 is a schematic diagram illustrating a further embodiment for generating input signals to the flip-flop circuit using the signal generator of the present invention.

FIG. 8 shows an embodiment which employs the signal generator of the invention of FIG. 6A for generating input signals to the flip-flop circuit, and where the probe beam 1a consists of a focused ion beam having a beam diameter of 0.1 μm and a beam current of 100 pA. The NAND gate 6 which constitutes the flip-flop circuit has a C-MOS structure. If the set terminal 8 and the reset terminal 7 are alternatingly irradiated with the beam, the flip-flop repeats the set and reset operations making it possible to set a logical state in the device with a weak beam current (=100 pA).

Figure 9A:
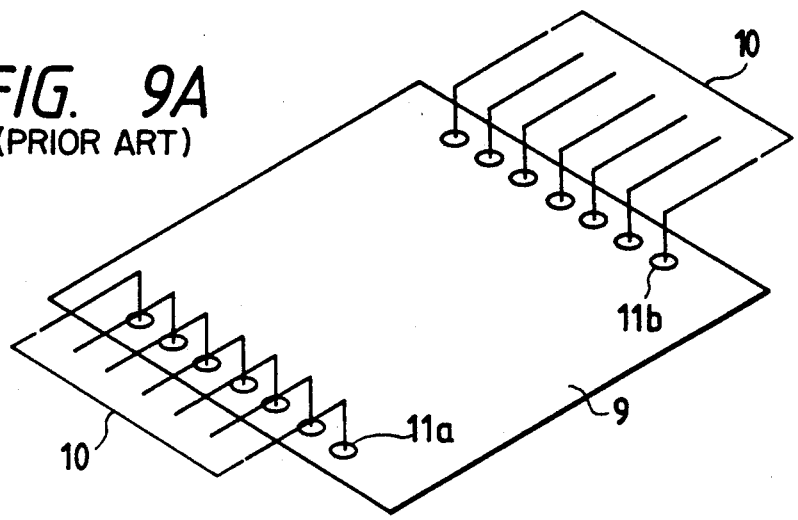
FIG. 9A is a diagram illustrating a conventional method of testing large-scale integrated circuits.
Figure 9B:
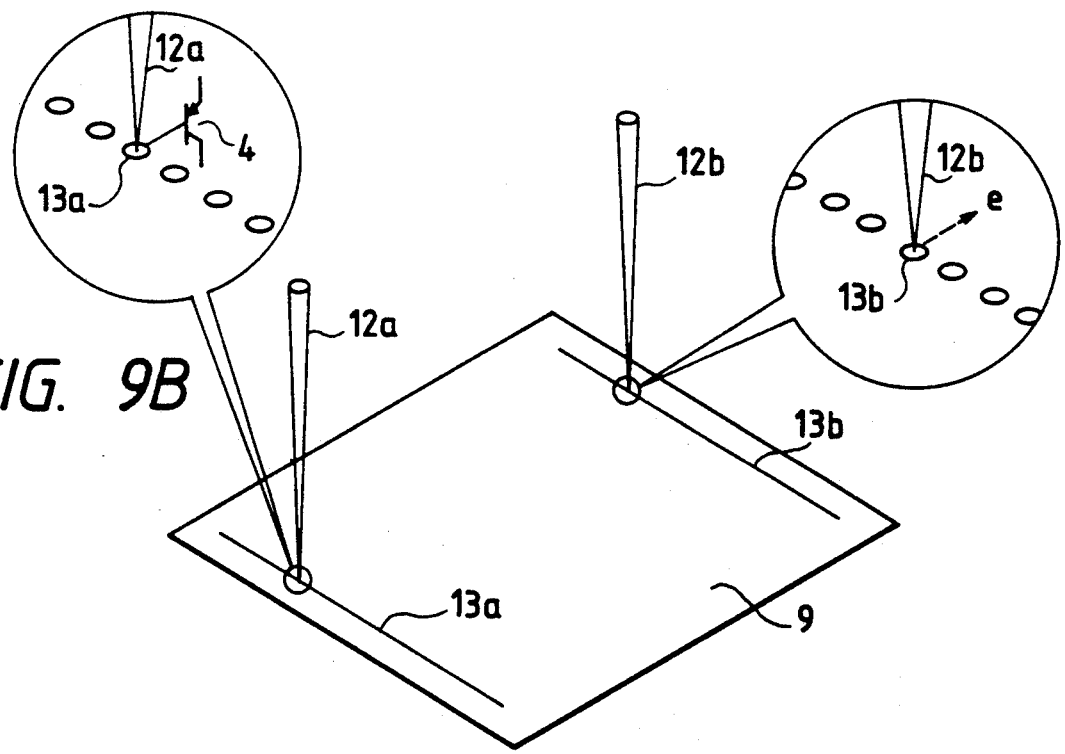
FIG. 9B is a diagram illustrating a method of testing large-scale integrated circuits including a signal generator according to the present invention.

FIG. 9B is a diagram of an embodiment of when the signal generating circuit of the present invention is used for testing and repairing the large-scale integrated circuits. So far as shown in FIG. 9A, a needle probe 10 is brought into contact with input and output pads 11a, 11b from the external side to input and take out the signals, in order to test a large-scale integrated circuit 9 to find defective portions. However, this method must carry out mechanical contacting. Therefore, the pads 11a and 11b must have relative large areas, imposing limitation on the number of pads that can be provided. Accordingly, the range of testing is limited and the accuracy becomes poor. When the large-scale integrated circuit 9 is to be tested according to the embodiment of FIG. 9B, the signal generators 4 of the present invention are arranged in a plural number in the large-scale integrated circuit 9, and small input pads 13a are irradiated with a focused electron beam 12a to generate logic signals in addition to inputting and taking out signals using the conventional needle probe 10 and the pads 11a, 11b, in order to equivalently increase the number of input signals. The output signals can be measured by detecting the secondary electrons e that are emitted by irradiating the small output pad 13b with the electron beam 12b. The pads 13a, 13b for irradiation with the electron beam need have a diameter nearly equal to that of the beam. Therefore, no strict limitation is imposed on the number of pads unlike the conventional pads 11a, 11b.

Though the foregoing embodiment has dealt with the case where small pads 13a and 13b were provided, it needs not be pointed out that a portion of the line pattern of the signal generating circuit 4 may be irradiated with the charged particle beam without providing the pads 13a, 13b.

The above-mentioned constitution broadens the testing range of the large-scale integrated circuit and makes it easy to detect faults on, for example, the gate level. Moreover, operation mode of the device can be permanently corrected by using the output signals of the signal generator of the present invention as input data and write enable signals for the nonvolatile memory.

The present invention provides such effects that signals can be generated at high speeds in the device even when a weak charged beam is used, that the point of irradiation with the beam can be set at any place, and that the device is not broken down by the irradiation with the beam.

We claim:

1. In a signal generator for generating voltage signals in a semiconductor device upon irradiation with a charged particle beam, the improvement wherein a circuit that converts a beam current of the irradiated charged particle beam into said voltage signals is comprised of a bipolar transistor having a current amplification function and a load device that are incorporated in said semiconductor device, further comprising means for irradiating a finely focused charged particle beam onto a portion of a line pattern connected to the base of the bipolar transistor to generate said voltage signal.

2. A signal generator according to claim 1, further comprising means for irradiating an ion beam onto said semiconductor device, wherein said bipolar transistor is of the npn type.

3. A signal generator according to claim 1, further comprising means for irradiating an electron beam onto said semiconductor device, wherein said bipolar transistor is of the pnp type.

4. A signal generator according to claim 1, wherein said circuit that converts a beam current comprises a plurality of bipolar transistors that are connected in a plurality of stages to increase the current amplification factor.

5. A signal generator according to claim 1, further comprising means for irradiating an electronic beam onto said semiconductor device, wherein a portion of the line pattern to be irradiated with the beam is comprised of a material having a low yield of secondary electrons.

6. A signal generator according to claim 1, further comprising means for irradiating an ion beam onto said semiconductor device, wherein a portion of the line pattern to be irradiated with the beam is comprised of a material having a high yield of secondary electrons.

7. A signal generator according to claim 1, wherein a portion of said line pattern to be irradiated with the beam is formed in the shape of a Faraday cup.

8. A signal generator according to claim 1, wherein said bipolar transistor has its emitter grounded.

9. A signal generator according to claim 1, further comprising means for directing the irradiation by the charged particle beam only to a line pattern connected to the base of the bipolar transistor, to prevent direct irradiation of the bipolar transistor.

10. In a signal generator for generating voltage signals in a semiconductor device upon irradiation with a charged particle beam, the improvement wherein a circuit that converts a beam current by the irradiation of said charged particle beam into the voltage signals is comprised of bipolar transistors connected in plural stages and by a load device that are contained in said semiconductor device, said circuit being so formed that a bipolar transistor of an input stage of said plural stages has a current amplification function and will not amplify the voltage, further comprising means for irradiating a finely focused charged particle beam onto a portion of a line pattern connected to a signal input terminal of the bipolar transistor of the input stage in said voltage signal generating circuit.

11. A signal generator according to claim 10, wherein said voltage signal generator circuit is comprised of a cascade circuit base don the combination of a common-emitter circuit of a bipolar transistor in the input stage and a common-base circuit of a bipolar transistor in a second stage of the plural stages.

12. A signal generator according to claim 10, wherein said voltage signal generating circuit is comprised of a two-stage series common-emitter circuit comprised of complementary transistors.

13. A signal generator according to claim 10, further comprising means for irradiating an electron beam onto said semiconductor device, wherein a portion of said line pattern irradiated with said electron beam is comprised of a material having a low yield of secondary electrons.

14. A signal generator according to claim 10, further comprising means for irradiating an ion beam onto said semiconductor device, wherein a portion of said line pattern irradiated with said ion beam is comprised of a material having a high yield of secondary electrons.

15. A signal generator according to claim 10, wherein a portion of the line pattern irradiated with said changed particle beam is formed in the shape of a Faraday cup.

16. A signal generator according to claim 10, further comprising means for directing the irradiation only to said line pattern to prevent direct irradiation of the bipolar transistor of the input stage.

* * * * *